(12) United States Patent
Kroehnert

(10) Patent No.: US 12,046,490 B2
(45) Date of Patent: Jul. 23, 2024

(54) BONDING HEAD FOR MOUNTING COMPONENTS AND DIE BONDER WITH SUCH A BONDING HEAD

(71) Applicant: BESI Switzerland AG, Steinhausen (CH)

(72) Inventor: Rene Kroehnert, Lucerne (CH)

(73) Assignee: BESI Switzerland AG (CH)

( * ) Notice: Subject to any disclaimer, the term of this patent is extended or adjusted under 35 U.S.C. 154(b) by 283 days.

(21) Appl. No.: 16/180,243

(22) Filed: Nov. 5, 2018

(65) Prior Publication Data

US 2019/0157122 A1   May 23, 2019

(30) Foreign Application Priority Data

Nov. 17, 2017 (CH) ..................... 01396/17
Aug. 6, 2018 (CH) ..................... 00957/18

(51) Int. Cl.
*H01L 21/67* (2006.01)
*H01L 23/00* (2006.01)
*H01L 21/683* (2006.01)

(52) U.S. Cl.
CPC .. *H01L 21/67144* (2013.01); *H01L 21/67098* (2013.01); *H01L 21/6835* (2013.01);
(Continued)

(58) Field of Classification Search
CPC ............... H01L 21/67144; H01L 24/75; H01L 24/67144; H01L 24/83; H05K 13/0408;
(Continued)

(56) References Cited

U.S. PATENT DOCUMENTS 5,093,596 A    3/1992 Hammer
5,952,744 A *  9/1999 Chitayat ................ H02K 41/03
                                                      310/12.31
(Continued)

FOREIGN PATENT DOCUMENTS

JP    H-06-177180 A      6/1994
JP    2979772 B2 *      11/1999
(Continued)

OTHER PUBLICATIONS

Singapore Patent Office Search Report in related case dated Jul. 29, 2021.
(Continued)

*Primary Examiner* — Livius R. Cazan
(74) *Attorney, Agent, or Firm* — CanaanLaw, P.C.; David B. Ritchie

(57) ABSTRACT

A bonding head for mounting components comprises a shaft and a housing part in which the shaft is supported. The bearing of the shaft enables a rotation of the shaft about an axis and a displacement of the shaft in the longitudinal direction of the axis by a predetermined stroke. The bonding head further comprises an electric motor with a stator attached to the housing part and a rotor attached to the shaft, an encoder for measuring the rotational position of the shaft, and a force generator for applying a force to the shaft. The stator comprises coils to which currents can be applied, the rotor comprises a plurality of permanent magnets. A length of the permanent magnets measured in the longitudinal direction of the axis is shorter or longer than an effective length of the coils measured in the longitudinal direction of the axis by at least the stroke.

8 Claims, 8 Drawing Sheets

Figure 1:
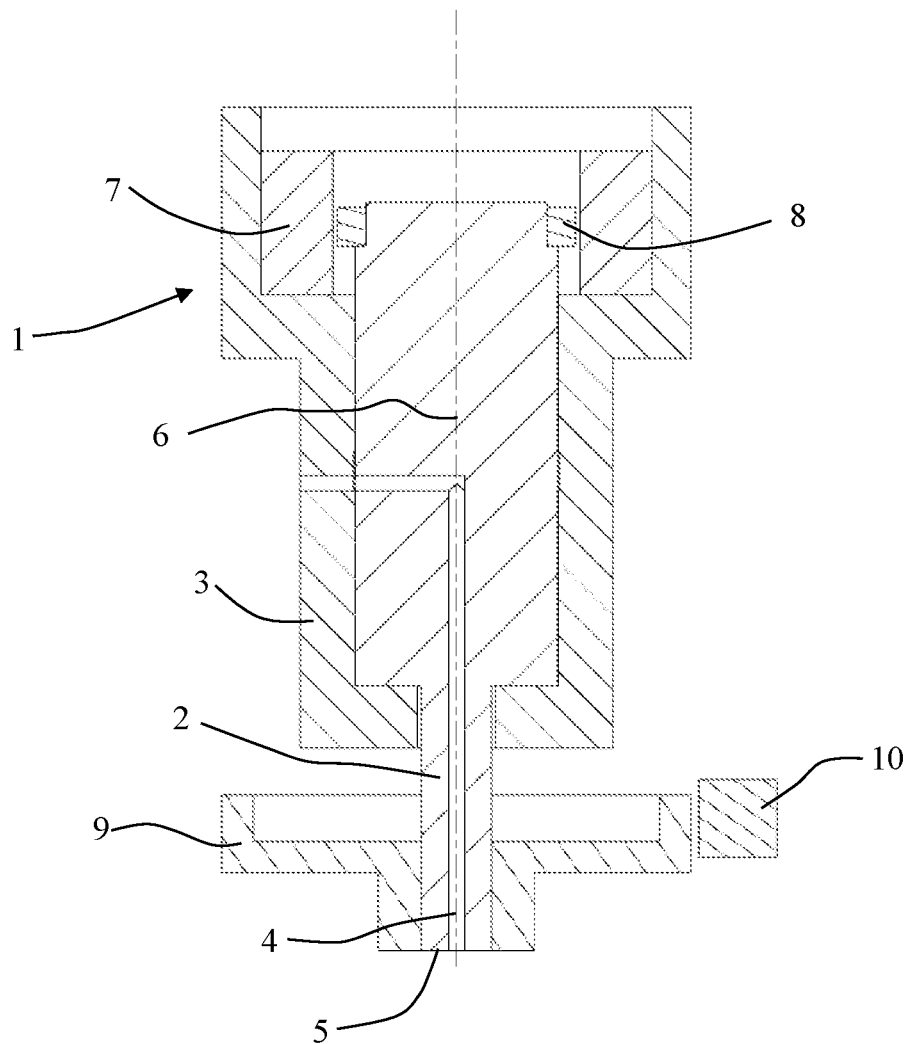

(52) U.S. Cl.
CPC .... *H01L 24/75* (2013.01); *H01L 2224/75745* (2013.01); *H01L 2224/7592* (2013.01)

(58) Field of Classification Search
CPC .... H05K 13/0409; H02K 1/278; H02K 1/276; H02K 1/2766
See application file for complete search history.

(56) References Cited

U.S. PATENT DOCUMENTS

| | | | |
|---|---|---|---|
| 2004/0042890 | A1 | 3/2004 | Hirata |
| 2005/0048162 | A1* | 3/2005 | Teng ............... F15B 15/063 425/574 |
| 2007/0176497 | A1 | 8/2007 | Chitayat et al. |
| 2010/0314050 | A1* | 12/2010 | Wong ................ H01L 24/83 156/538 |
| 2011/0048648 | A1 | 3/2011 | Ng et al. |
| 2014/0175159 | A1* | 6/2014 | Kostner ............ H01L 24/75 228/102 |
| 2014/0202636 | A1 | 7/2014 | Mayr |
| 2014/0311652 | A1 | 10/2014 | Kostner et al. |
| 2015/0159681 | A1* | 6/2015 | Kajinami .......... F15B 15/063 92/5 R |
| 2017/0234365 | A1* | 8/2017 | Oshida ............. B24B 41/04 451/259 |

FOREIGN PATENT DOCUMENTS

| | | | |
|---|---|---|---|
| JP | 2001300881 A | 10/2001 | |
| JP | 2003-319633 A | 11/2003 | |
| JP | 2008-288473 A | 11/2008 | |
| JP | 2014-123731 A | 7/2014 | |
| JP | 2015-113868 A | 6/2015 | |
| JP | 2017-144516 A | 8/2017 | |
| WO | WO-2010036204 A1 * | 4/2010 | ......... H05K 13/0408 |

OTHER PUBLICATIONS

Japan Patent Office Search Report and Office Action in related case dated Nov. 15, 2022.
French Patent Office Preliminary Search Report Dated Dec. 12, 2019 regarding related case.

* cited by examiner

US 12,046,490 B2

BONDING HEAD FOR MOUNTING COMPONENTS AND DIE BONDER WITH SUCH A BONDING HEAD

PRIORITY CLAIM

Applicant hereby claims foreign priority under 35 U.S.C § 119 from Swiss Application No. 01396/17 filed Nov. 17, 2017 and Swiss Application No. 00957/18 filed Aug. 6, 2018, the disclosures of which are hereby incorporated herein by reference.

FIELD OF THE INVENTION

The invention concerns a bonding head for mounting components, typically electronic or optical components, in particular semiconductor chips and flip chips, on a substrate. The mounting process is also referred to as bonding or assembly process. The invention also concerns a semiconductor mounting apparatus, known in the industry as a Die Bonder, with such a bonding head.

BACKGROUND OF THE INVENTION

Automatic assembly machines with bonding heads of this type are used particularly in the semiconductor industry. An example of such automatic assembly machines are die bonders or pick & place machines, which are used to place and bond components in the form of semiconductor chips, micromechanical and microoptical components and the like onto substrates such as leadframes, printed circuit boards, ceramics, etc. The components are picked up by a bonding head at a pick-up location, in particular sucked in, moved to a substrate location and placed on the substrate at a precisely defined position. The bonding head is part of a pick and place system that allows movements of the bonding head in at least three spatial directions.

The bonding head includes a shaft rotatable about an axis and movable in the longitudinal direction of the axis, a drive to rotate the shaft, an encoder to measure the rotational position of the shaft, and a force generator to apply a force to the shaft in the longitudinal direction of the axis. The shaft picks up a component directly or is configured to pick up a chip gripper, e.g., a "die collet", configured to pick up a component.

A bonding head used by the applicant comprises a drive comprising an electric motor and a gear formed of two toothed wheels, one of which is attached to the shaft of the electric motor and the other to the shaft of the bonding head.

BRIEF DESCRIPTION OF THE INVENTION

The object of the invention is to develop a bonding head with which the rotational position of the shaft can be positioned with a higher angular accuracy and with which the shaft can be moved in the longitudinal direction of the axis with as little force as possible.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not drawn to scale.

Figure 2:
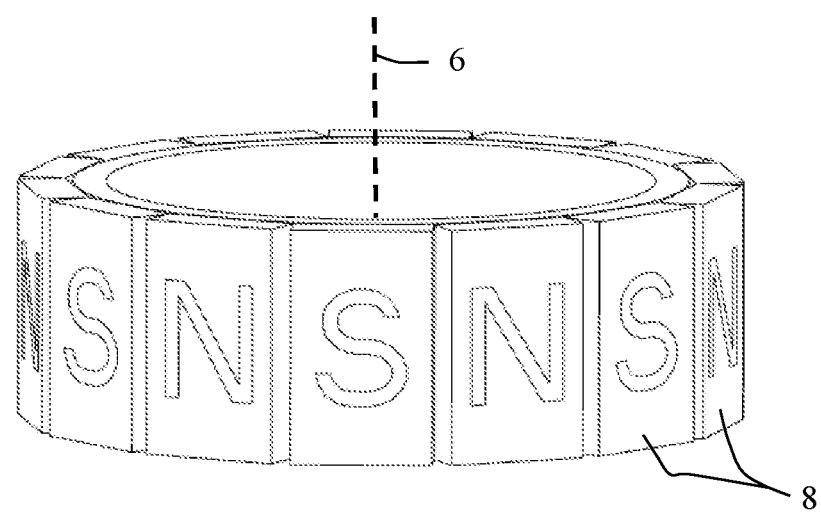
Figure 3:
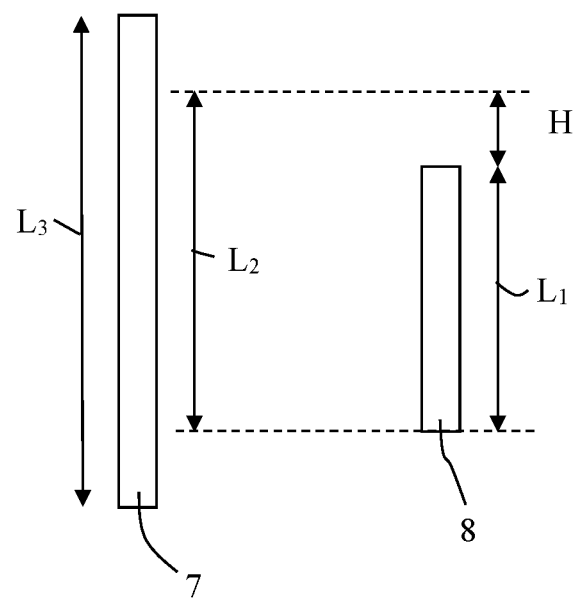
Figure 4:
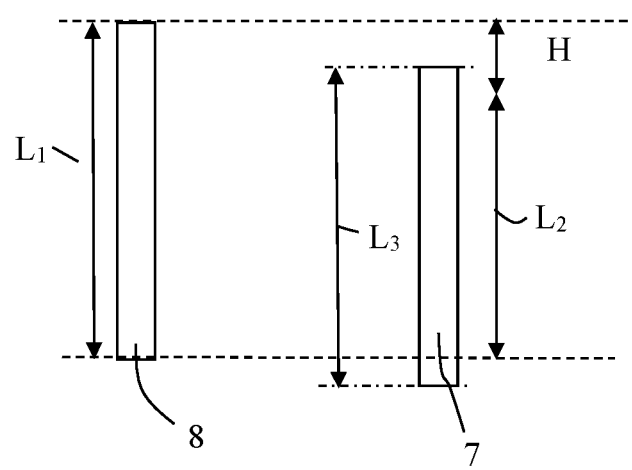
Figure 5:
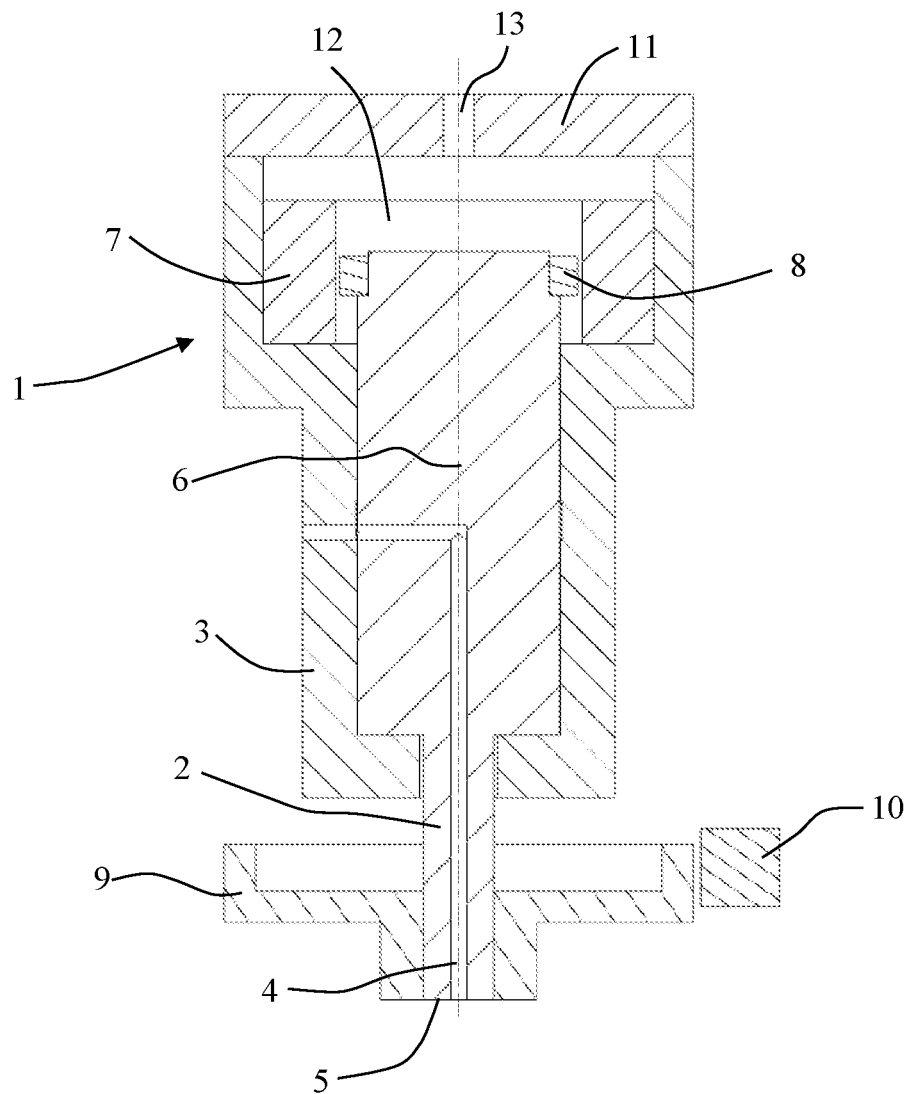
Figure 6:
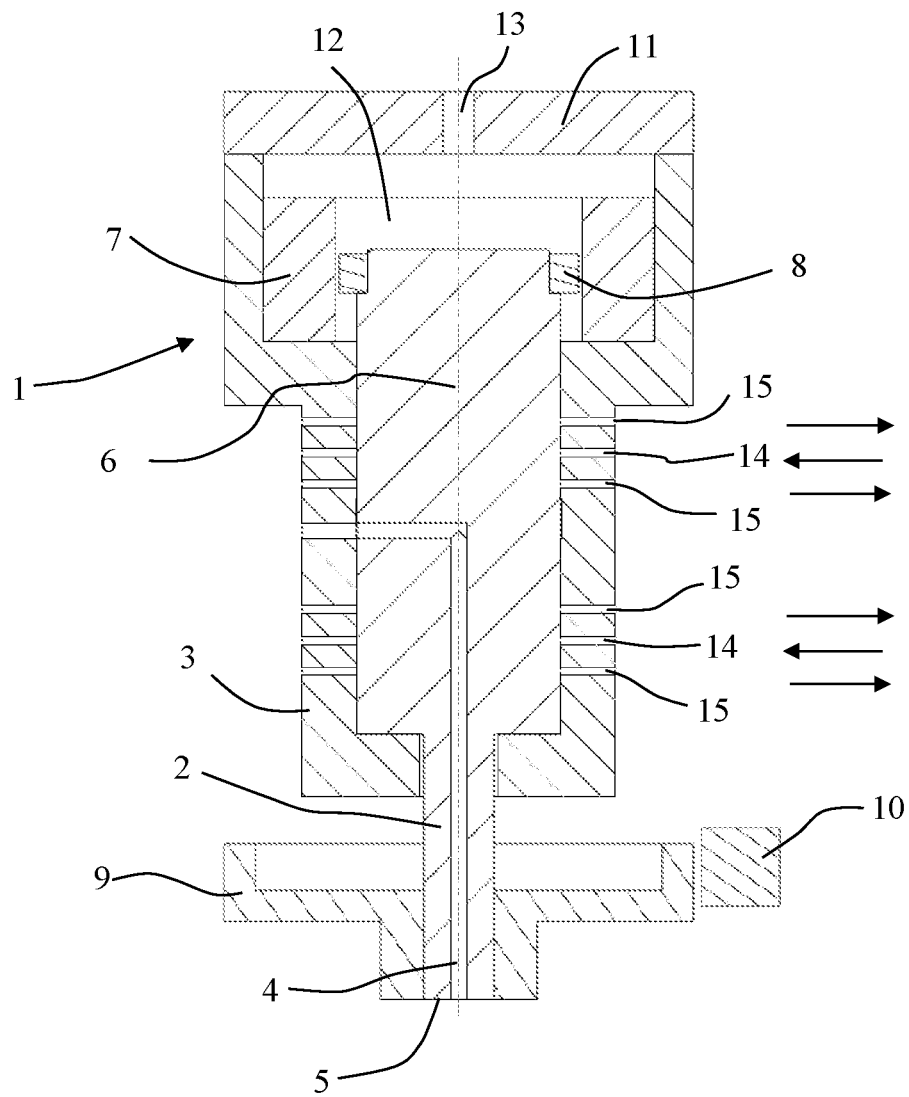
Figure 7:
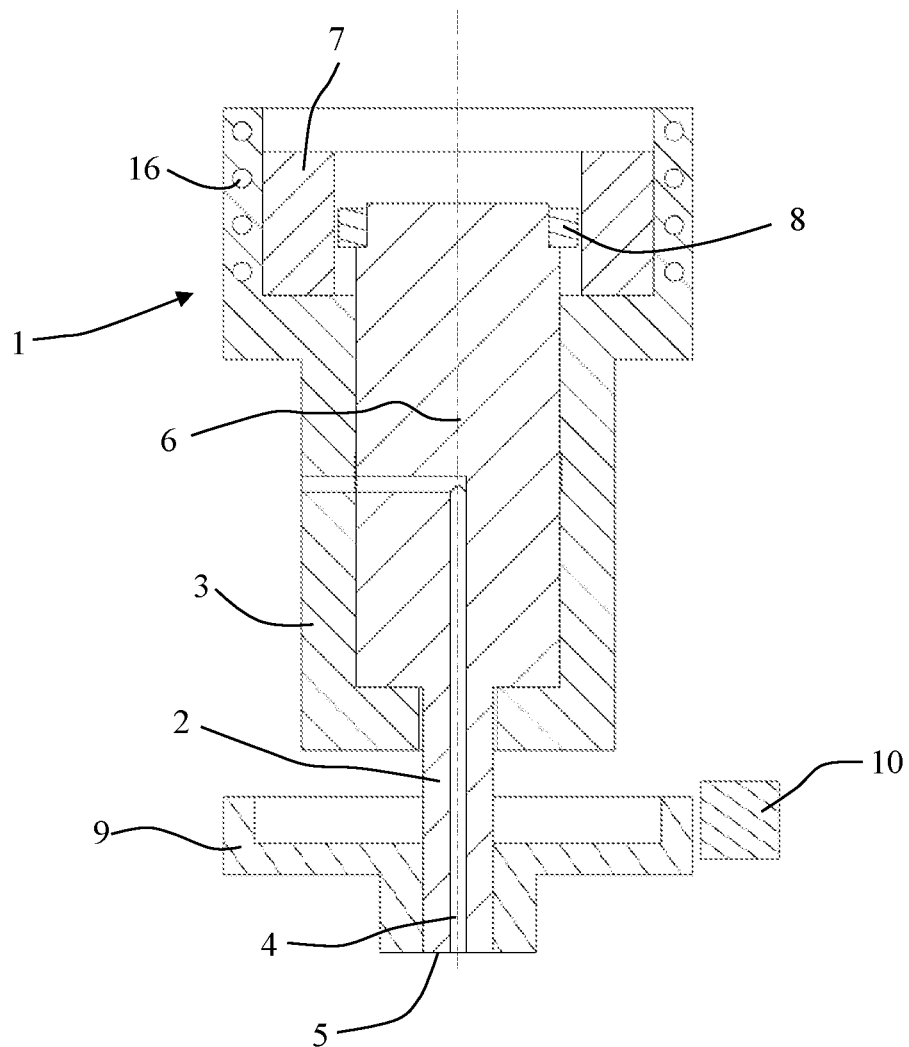
Figure 8:
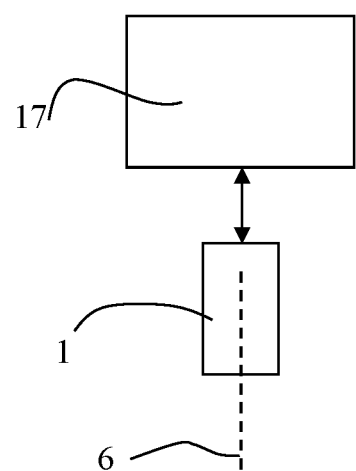

In the drawings:

FIG. 1 shows schematically and in cross section a first embodiment of a bonding head, FIG. 2 shows the magnet arrangement of the rotor of an electric motor used in the bonding head, FIGS. 3 and 4 illustrate length ratios, FIG. 5 shows schematically and in cross-section a bonding head with a pneumatic force generator, FIG. 6 shows schematically and in cross-section a bonding head with a pneumatic force generator and an air bearing, FIG. 7 shows schematically and in cross-section a bonding head with an integrated temperature control device, and FIG. 8 schematically shows a drive for the bonding head.

DETAILED DESCRIPTION OF THE INVENTION

FIG. 1 schematically shows the cross-section of a bonding head 1. The bonding head 1 comprises a shaft 2 and a housing part 3, in which the shaft 2 is supported. The shaft 2 contains a hole 4 which leads to the tip 5 of the shaft 2 and can be supplied with vacuum. The tip 5 of the shaft 2 is configured to receive a component or a chip gripper for a component. The bearing of the shaft 2 allows both a rotation of the shaft 2 around an axis 6 and a displacement of the shaft 2 in the longitudinal direction of the axis 6 by a predetermined stroke H (FIG. 3). The diameter of the shaft 2 can have different gradations over its length, as shown in FIGS. 1, 5 and 6. The bonding head 1 further comprises a drive configured to rotate the shaft 2 about the axis 6, an encoder configured to measure the rotational position of the shaft 2, and a force generator configured to apply a force to the shaft 2 in the longitudinal direction of the axis 6. The force is, for example, a predetermined pick force when picking up a component or a predetermined bond force when mounting the component on a substrate.

The drive is an electric motor comprising a stator and a rotor, the stator being attached to the housing part 3 and the rotor to the shaft 2. The stator comprises coils 7 which can be supplied with currents, and the rotor comprises a plurality of permanent magnets 8.

In principle, the electric motor is a commercially available electric motor, which was modified for the purposes of the invention so that the length of the permanent magnets 8 was shortened by at least the stroke H. This modification reduces the torque, but is technically simple and has the advantage that at the same time the mass of the rotor becomes smaller or can be reduced or even minimized at the expense of the torque. The alternative of extending the length of the coils 7 by at least the stroke H is also possible, but not preferred. The permanent magnets 8 are—as shown in FIG. 2—flat, parallelepipedal magnets, with their two opposing largest surfaces magnetized as north pole N and south pole S. The permanent magnets 8 are arranged on a circle. Their largest area facing the center of the circle is alternately a north pole N and a south pole S. Their largest area facing away from the center of the circle is then alternately a south pole S and a north pole N.

The electric motor serves to rotate the shaft 2 around the axis 6. Since the shaft 2 must be displaceable in the longitudinal direction of the axis 6, the length $L_1$ (FIG. 3) of the permanent magnets 8 is either shorter by at least the stroke H or longer than the effective length $L_2$ of the coils 7 by the stroke H, so that the forces exerted by the coils 7 on the permanent magnets 8 are independent of the position occupied by the shaft 2 along the longitudinal direction of the axis 6. The coils 7 have a predetermined mechanical length $L_3$ in the longitudinal direction of the axis 6. The effective length $L_2$ designates the length within which the magnetic field generated by the currents flowing through the entirety of the coils 7 and causing the rotation of the permanent magnets 8 about the axis 6 provides the main part of the forces acting on the permanent magnets 8. The effective length $L_2$ is therefore shorter than the mechanical length $L_3$. FIG. 3 illustrates the case where the length $L_1$ of the permanent magnets 8 is shorter by the stroke H than the effective length $L_2$ of the coils 7, and FIG. 4 illustrates the inverse case where the length $L_1$ of the permanent magnets 8 is longer by the stroke H than the effective length $L_2$ of the coils 7. It is therefore $$L_1 \leq L_2 - H \text{ or } L_1 \geq L_2 + H$$

In the first case, the permanent magnets 8 (and thus the rotor) remain in the magnetic field of the coils 7 even during the axial displacement of the shaft 2 along the axis 6; in the second case, the permanent magnets 8 extend beyond the coils 7 during the entire axial displacement. During the axial displacement of the shaft 2, in both cases at most a very small force or change in force acting along the axis 6 occurs.

The encoder is configured to measure the rotational position of the shaft 2. The encoder is preferably formed by a circular disc 9 attached to the shaft 2 and with an encoder scale attached to its edge, and an encoder reading head 10 attached to the bonding head 1, preferably to the housing part 3 of the bonding head 1. The encoder scale has dashes running in the longitudinal direction of the axis 6. The length of the dashes measured in the longitudinal direction of the axis 6 and the measuring range of the encoder reading head 10 extending in the longitudinal direction of the axis 6 are matched so that the dashes lie in the measuring range of the encoder reading head 10 over the entire stroke H of the shaft 2.

An angle sensor can also be used as encoder, for example a magnetic angle sensor, which determines the rotational position based on the magnetic field generated by the permanent magnets 8, or an optical angle sensor, or any other angle sensor.

The force generator is used to generate both the pick force and the bond force. For example, a mechanical force generator can be used as force generator, in particular a force generator in which a spring is used which acts on the shaft 2 to generate a force acting in the longitudinal direction of the axis 6. A pneumatic force generator can also be used as force generator, as is the case with the bonding heads 1, which are shown schematically and in cross-section in FIGS. 5 and 6. Here the housing part 3 and a cover 11 placed on the housing part 3 form together with the shaft 2 a closed cavity 12, the volume of which changes during the longitudinal movement of the shaft 2. The cover 11 contains a bore 13 through which the cavity 12 can be pressurized with compressed air. The cavity 12 thus forms a pressure chamber and the pressure prevailing in the pressure chamber generates a force acting on the shaft 2. The movement of the shaft 2 in the longitudinal direction of the axis 6, i.e., the stroke H, is limited, for example, by a stop. On the one hand, in the unloaded state the force generated by the force generator causes the shaft 2 to be pressed against the stop. On the other hand, the force acts on the component as a picking force when picking a component and as a bonding force when depositing a component, because the shaft 2 is pushed away from the stop during picking and bonding. The movement of the shaft 2 during these process steps is a passive movement resulting from the fact that the shaft 2 comes to a standstill when it lands on the component as well as when the component lands on the substrate, while the bonding head 1 driven by a drive 17 (FIG. 8) is lowered even further until the touchdown is detected and the drive 17 stopped.

The bearing of the shaft 2 in the housing part 3 can be, for example, a slide bearing, a ball bearing, an air bearing or another suitable bearing. In the exemplary embodiment shown in FIG. 5, the shaft 2 is supported in the housing part 3 by a slide bearing, in the exemplary embodiment shown in FIG. 6 by an air bearing. With the air bearing, the housing part 3 has air inlets for the supply of compressed air. In a preferred design of the air bearing, the housing part 3 also has air outlets for the removal of air from the air bearing. The air inlets, for example, are first boreholes 14 and the air outlets, for example, second boreholes 15. If air inlets and outlets are present, the air inlets are located in the longitudinal direction of the axis 6 between some of the outlets. The air outlets can be connected to the environment so that the ambient pressure is exerted on them, or a vacuum can be applied to the air outlets in order to suck off the air forced into the air bearing through the air inlets. The flow direction of the air in the air inlets and air outlets is illustrated in FIG. 6 by (laterally offset) arrows. With this arrangement, in which the air inlets are surrounded by the air outlets, it is prevented that a part of the air, which is pressed through the air inlets into the gap between the shaft 2 and the housing part 3, reaches the cavity 12 and thus changes the force acting on the shaft 2 in the longitudinal direction of the axis 6.

FIG. 7 shows schematically and in cross-section a bonding head with a temperature control device. The temperature control device serves to keep the temperature of predetermined parts of the bonding head 1 at a predetermined value. The temperature control device comprises, for example, a pipe 16 which is advantageously integrated into the housing part 3 as shown and which is part of a closed thermal circuit through which a fluid flows whose temperature is controlled to the predetermined value in an external heating or cooling or heating and cooling device. The fluid can be gaseous or liquid. In certain cases, the temperature control device is an electrical heating resistor integrated in the housing part 3. The temperature control device can be used with all bonding heads 1. For example, on a bonding head 1 with a pneumatic force generator, it can be used to control the temperature in the pressure chamber to a predetermined value so that the force generated by the force generator is independent of variations in ambient temperature.

The bonding head according to the invention is typically used in a semiconductor mounting apparatus, known in the industry as Die Bonder. Such a semiconductor mounting apparatus comprises a drive 17 configured to move the bonding head 1 in the longitudinal direction of the axis 6. When picking a component and when bonding the component, the bonding head 1 is lowered by this drive 17, whereby the shaft 2 is passively carried along.

The bonding head offers several advantages, namely:
  The drive according to the invention for turning the shaft, in which the rotor is attached directly to the shaft, is a direct drive and thus a play-free drive, which enables a play-free and thus high-precision moving to the rotational position of the shaft. This is in contrast to known bonding heads, where a gear is interposed between the drive and the shaft.
  The measurement of the rotational position of the shaft is a direct and also play-free measurement, as the encoder scale is mounted on the disc attached to the shaft.

The direct drive of the shaft without gear and without toothed belt or the like is wear-free and does not produce any abrasion. This is particularly advantageous in cleanroom environments where abrasion could damage ICs resulting in a contamination of a semiconductor chip with particles.

The axial displacement of the shaft, i.e., the displacement of the shaft along its longitudinal axis, is substantially free of force. This means that the displacement of the shaft along the longitudinal axis during the build-up of the pick force or the bond force does not generate any additional force that increases or decreases the force generated by the force generator. This is in contrast to known bonding heads in which a toothed gear or belt is interposed between the drive and the shaft.

The design is space-saving, compact and allows the relatively large bond force required for the mounting of semiconductor components to be generated in a small space and with small weight.

The mass of the shaft inclusive the rotor is very small. The temporary force exerted on the component when the shaft hits it is proportional to the momentum, i.e., the product of the mass and speed of the shaft, and must not exceed a predetermined value, otherwise the component could be damaged. A smaller mass allows a higher speed and thus results in a shorter cycle time.

The design of the bonding head with an air bearing allows an almost friction-free rotation and displacement of the shaft.

The design of the bonding head with a temperature control device makes it possible to minimize or eliminate influences of temperature fluctuations of the environment on the bonding head and thus on the bonding process.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A die bonder comprising:
 a bonding head adapted to mount components to a substrate; and
 a drive configured to move the bonding head along a longitudinal axis extending orthogonal to a substrate support;
 the bonding head comprising
 a shaft extending along the longitudinal axis;
 a housing part comprising a bearing for the shaft which allows rotation of the shaft about the longitudinal axis and movement of the shaft along the longitudinal axis about a predetermined stroke;
 a single electric motor drive for only rotationally driving the shaft about the longitudinal axis, the drive coaxial with the shaft, the drive having a stator attached to the housing part and a rotor attached to the shaft;
 an encoder coupled to the shaft to measure a rotational position of the shaft about the longitudinal axis;
 a pneumatic force generator coupled coaxially to the shaft to apply a force to the shaft only along the longitudinal axis;
 wherein
 the pneumatic force generator has a single pressure chamber to which compressed air can be supplied, wherein the pressure prevailing in the single pressure chamber acts on an end of the shaft;
 the rotor includes a plurality of permanent magnets fixed to the rotor and arranged on a circle with an area facing a center of the circle being alternately a north pole N and a south pole S, all of the plurality of permanent magnets being located in a single plane normal to the longitudinal axis;
 the stator includes a set of coils to which a corresponding set of currents can be applied, wherein the magnetic field generated by the set of currents flowing through the corresponding set of coils causes only rotation of the rotor about the longitudinal axis;
 a length of the permanent magnets measured along the longitudinal axis is shorter than an effective length of the coils measured along the longitudinal axis by at least the stroke so that the same amount of overlap between the coils and each of the permanent magnets exists throughout the stroke thereby substantially avoiding changes in force along the longitudinal axis during axial displacement of the shaft within the predetermined stroke; and
 wherein the bonding head comprises no coils for causing movement of the shaft along the longitudinal axis.

2. The die bonder according to claim 1, wherein the encoder comprises a circular disc fixed to the shaft and having an encoder scale attached to its edge, and an encoder reading head, wherein
 the encoder scale has dashes extending along the longitudinal axis, and
 a length of the dashes measured along the longitudinal axis and a measuring region of the encoder reading head extending along the longitudinal axis are matched to one another in such a way that the dashes lie in the measuring region of the encoder reading head over the entire stroke of the shaft.

3. The die bonder according to claim 2, wherein the bearing is an air bearing, wherein the housing part has air inlets for the supply of compressed air and air outlets for the removal of air from the air bearing, wherein the air inlets are arranged in the longitudinal direction of the axis between some of the air outlets.

4. The die bonder according to claim 3, further comprising a temperature control device serving to maintain the temperature of predetermined parts of the bonding head at a predetermined value.

5. The die bonder according to claim 2, further comprising a temperature control device serving to maintain the temperature of predetermined parts of the bonding head at a predetermined value.

6. The die bonder according to claim 1, wherein the bearing is an air bearing, wherein the housing part has air inlets for the supply of compressed air and air outlets for the removal of air from the air bearing, wherein the air inlets are arranged in the longitudinal direction of the axis between some of the air outlets.

7. The die bonder according to claim 6, further comprising a temperature control device serving to maintain the temperature of predetermined parts of the bonding head at a predetermined value.

8. The die bonder according to claim 1, further comprising a temperature control device serving to maintain the temperature of predetermined parts of the bonding head at a predetermined value.

* * * * *